(12) United States Patent
Weijiang et al.

(10) Patent No.: US 8,040,655 B2
(45) Date of Patent: Oct. 18, 2011

(54) SUBSTRATE HOLD APPARATUS AND METHOD FOR JUDGING SUBSTRATE PUSH-UP STATE

(75) Inventors: Zhao Weijiang, Kyoto (JP); Ai Taura, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 344 days.

(21) Appl. No.: 12/021,817

(22) Filed: Jan. 29, 2008

(65) Prior Publication Data

US 2008/0285203 A1 Nov. 20, 2008

(30) Foreign Application Priority Data

Jan. 31, 2007 (JP) ................. 2007-021021

(51) Int. Cl.
*H01L 21/683* (2006.01)
(52) U.S. Cl. ....................................... 361/234
(58) Field of Classification Search ............ 361/234
See application file for complete search history.

(56) References Cited

U.S. PATENT DOCUMENTS

| | | | | |
|---|---|---|---|---|
| 5,677,824 A * | 10/1997 | Harashima et al. | ........... | 361/234 |
| 6,646,857 B2 | 11/2003 | Anderson et al. | | |
| 6,938,505 B2 * | 9/2005 | Chen et al. | ........... | 73/865.9 |
| 2006/0238953 A1 * | 10/2006 | Hanawa et al. | ........... | 361/234 |

FOREIGN PATENT DOCUMENTS

| | | |
|---|---|---|
| JP | 2-257455 | 10/1990 |
| JP | 4-110274 | 4/1992 |
| JP | 10183345 A * | 7/1998 |
| JP | 2004-119792 | 4/2004 |
| JP | 2004-228488 | 8/2004 |
| JP | 2004-531883 | 10/2004 |
| JP | 3814905 | 6/2006 |

OTHER PUBLICATIONS

Patent Abstracts of Japan for Japanese Publication No. 2004-119792, Publication date Apr. 15, 2004 (2 pages).
Patent Abstracts of Japan for Japanese Publication No. 10-183345, Publication date Jul. 14, 1998 (2 pages) (Corresponds to JP3814905).
Japanese Office Action for Japanese Application No. 2007-021021, dated Nov. 6, 2008 (9 pages).
Patent Abstracts of Japan for Japanese Publication No. 2004-228488, Publication date Aug. 12, 2004 (1 page).

* cited by examiner

*Primary Examiner* — Rexford Barnie
*Assistant Examiner* — Scott Bauer
(74) *Attorney, Agent, or Firm* — Osha • Liang LLP

(57) ABSTRACT

A substrate hold apparatus is provided an electrostatic chuck for electrostatically attracting and holding a substrate thereon, a push-up member contactable with a position of vicinity of an edge of the substrate on the electrostatic chuck from below for pushing up the substrate, a drive apparatus for driving at least one of the electrostatic chuck and push-up member to thereby allow the push-up member to push up the substrate, a force sensor for detecting a force applied to the push-up member in an pushing-up operation, and a control unit wherein the control unit is configured to measure the force from the force sensor as a first measurement, output a normal state signal when the measured force in the first measurement is equal to or larger than a lower limit value and is equal to or smaller than a upper limit value.

10 Claims, 11 Drawing Sheets

SUBSTRATE HOLD APPARATUS AND METHOD FOR JUDGING SUBSTRATE PUSH-UP STATE

The present invention claims priority from Japanese Patent Application No. 2007-021021 filed on Jan. 31, 2007, the entire content of which is incorporated herein by reference.

BACKGROUND OF INVENTION

1. Field of the Invention

The present invention relates to a substrate hold apparatus which is used in, for example, an ion implantation apparatus, an etching apparatus and a thin film forming apparatus and includes an electrostatic chuck for electrostatically attracting and holding a substrate thereon, and also relates to a method for judging the state of the substrate when it is pushed up using a push-up member after cutting off an applied voltage to the electrostatic chuck.

2. Description of the Related Art

In the below-cited Japanese Patent No. 3814905 (paragraphs 0010-0012, FIGS. 2-5), there is disclosed a substrate hold apparatus which includes an electrostatic chuck for electrostatically attracting and holding a substrate (for example, a semiconductor substrate) thereon, a push-up member contactable with a position of vicinity of an edge of the substrate on the electrostatic chuck from below for pushing up the substrate, and a drive apparatus for driving at least one of the electrostatic chuck and push-up member to thereby allow the push-up member to push up the substrate.

Even when the applied voltage to the above-mentioned electrostatic chuck is cut off after the substrate is attracted to the electrostatic chuck, for a certain period of time, electric charges remain between the electrostatic chuck and substrate, thereby generating a residual attracting force. Suppose the residual attracting force is large, when the substrate is removed from the electrostatic chuck, there are caused inconveniences in the substrate, for example, the substrate is caused to bounce, or to be shifted in position, or to be broken.

As means for preventing the generation of such inconveniences, in the below-cited JP-A-2004-119792 (paragraphs 0034, 0042, 0043, FIGS. 1 and 5), there is disclosed a technology in which there is provided a residual attracting force detect portion for detecting, as a residual attracting force, a load applied to a lift pin used to push up and remove the substrate from below, it is checked whether the detected residual attracting force is larger than a given value or not, and, when it is found larger, the processing is made to go to a different residual electric charge removing operation from an originally specified substrate processing operation. Specifically, a conductive wafer for removing residual electric charges is carried onto the electrostatic chuck, the conductive wafer is grounded to remove the residual electric charges, and, after then, the conductive wafer is taken out.

According to the technology disclosed in the above-cited JP-A-2004-119792, it is checked through a single residual attracting force judgment whether the residual attracting force is abnormal (that is, the residual attracting force is larger than a given value) or normal (that is, the residual attracting force is smaller than a given value). When it is found abnormal, immediately, the processing goes to a residual electric charge removing operation which is different from an originally specified substrate processing operation. However, when the processing goes to the residual electric charge removing operation, the originally specified substrate processing operation cannot be carried out during the time. This raises a problem that the throughput of the substrate (the processing performance of the substrate per unit time) is lowered greatly.

Also, according to in the JP-A-2004-119792, when it is judged that a residual attracting force (specifically, a load applied to the lift pin) detected by the residual attracting force detect portion is smaller than a given value, the processing as it goes to the originally specified substrate processing operation. However, when a detecting system (a sensor system) is abnormal or the substrate is abnormal, for example, when a load to be detected originally cannot be detected due to the abnormal state of the detecting system, or when the position of the substrate is shifted greatly on the electrostatic chuck and the load applied to the lift pin is thereby small, the load applied to the lift pin cannot be detected.

SUMMARY OF INVENTION

One or more embodiments of the invention to provide an apparatus and a method which not only may carefully check the residual attracting force existing between the electrostatic chuck and substrate to thereby prevent the lowered throughput but also, when the sensor system or substrate is abnormal, may detect the abnormal state of the sensor system or substrate.

According to a first aspect of the invention, a substrate hold apparatus is provided an electrostatic chuck for electrostatically attracting and holding a substrate thereon, a push-up member contactable with a position of vicinity of an edge of the substrate on the electrostatic chuck from below for pushing up the substrate, a drive apparatus for driving at least one of the electrostatic chuck and push-up member to thereby allow the push-up member to push up the substrate, a force sensor for detecting a force applied to the push-up member in an pushing-up operation, and a control unit wherein the control unit is configured to measure the force from the force sensor as a first measurement, output a normal state signal when the measured force in the first measurement is equal to or larger than a lower limit value and is equal to or smaller than a upper limit value, and output an abnormal state signal when the measured force in the first measurement is smaller than the lower limit value, the control unit is configured to measure again the force detected by the force sensor as a second measurement after waiting for a time when the measured force in the first measurement is larger than the upper limit value, output the normal state signal when the re-measured force in a second measurement is equal to or larger than the lower limit value and is equal to or smaller than the upper limit value, output the abnormal state signal when the re-measured force in the second measurement is smaller than the lower limit value, and the control unit outputs the abnormal state signal when the re-measured force in the second measurement is larger than the upper limit value.

According to a second aspect of the invention, the substrate hold apparatus is provided that the lower limit has a first lower limit in the first measurement and a second lower limit in the second measurement and the upper limit has a first upper limit in the first measurement and a second upper limit in the second measurement.

According to a third aspect of the invention, the substrate hold apparatus is provided that the push-up member and a support member supporting the force sensor is fixed a container inner wall.

According to a forth aspect of the invention, the substrate hold apparatus is provided that an up-and-down apparatus for pushing up a support member and the push-up member.

According to a fifth aspect of the invention, a method for judging a state of a substrate pushing-up comprising the steps of, 1) cutting an applied voltage to an electrostatic chuck, 2) measuring the force from a force sensor by a control unit as a first measurement, 3) outputting a normal state signal when the measured force in the first measurement is equal to or larger than a lower limit value and is equal to or smaller than a upper limit value, 4) outputting an abnormal state signal when the measured force in the first measurement is smaller than the lower limit value, 5) waiting for a time when the measured force in the first measurement is larger than the upper limit value, 6) measuring again the force detected by the force sensor as a second measurement, 7) outputting the normal state signal in the second measurement when the re-measured force is equal to or larger than the lower limit value and is equal to or smaller than the upper limit value, 8) outputting the abnormal state signal in the second measurement when the re-measured force is smaller than the lower limit value, and 9) outputting the abnormal state signal in the second measurement when the re-measured force is larger than the upper limit value.

According to a sixth aspect of the invention, the method for measuring a state of a substrate pushing-up is provided that the lower limit has a first lower limit in the first measurement and a second lower limit in the second measurement and the upper limit has a first upper limit in the first measurement and a second upper limit in the second measurement.

In the above-mentioned push-up operation, since the applied voltage to the electrostatic chuck has been previously cut off, the force detected by the force sensor provides the sum of a residual attracting force between the electrostatic chuck and substrate and a force provided by the weight of the substrate.

When the position of vicinity of an edge of the substrate is pushed up even if slightly by the push-up member and the substrate is thereby peeled off even if slightly from the electrostatic chuck, the above-mentioned residual attracting force weakens suddenly. Therefore, even if, in the first measurement, the residual attracting force is large and the force measured by the force sensor is larger than the upper limit value, when the force is detected again after waiting for a given time, the residual attracting force may decrease during the time between the first and second measurements and thus the force to be measured using the force sensor may be expected to become equal to or smaller than the upper limit value. When the measured force is equal to or smaller than the upper limit value, it may be judged that the state of the substrate is normal. Therefore, the judgment about the residual attracting force may be made carefully, thereby being able to prevent the lowered throughput.

On the other hand, when the states of the sensor system, substrate and the like are not abnormal, in either the first measurement or the re-measurement, the force sensor detects at least the force that is provided by the weight of the substrate. Therefore, when the states of the sensor system, substrate and the like are abnormal, the abnormal states may be detected by comparing the force measured by the force sensor with the lower limit value.

The upper limit value and lower limit value used for the judgment in the first measurement may also be referred to as a first upper limit value and a first lower limit value respectively. While the upper limit value and lower limit value used for the judgment in the re-measurement may also be referred to as a second upper limit and a second lower limit value respectively. In this case, the respective upper limit values and lower limit values may be used so as to correspond to actual conditions more properly, which makes it possible to make more accurate judgments.

According to the aspects of the invention, even when the force detected by the force sensor is larger than a given upper limit value in the first measurement and judgment, since, after waiting for a given time, the force is measured again and, after then, it is checked whether the re-measured force is larger than the given upper limit value or not, the judgment about the residual attracting force may be made carefully and thus the throughput may be prevented from lowering. Moreover, when the states of the sensor system, substrate and the like are abnormal, the abnormal states may be detected by comparing the force measured by the force sensor with the lower limit value.

According to another aspect of the invention, since the upper and lower limit values used for the judgment to be made in the first measurement are referred to as first upper and lower limit values respectively as well as the upper and lower limit values used for the judgment in the re-measurement are referred to as second upper and lower limit values respectively, the respective upper and lower limit values may be used so as to correspond to actual conditions more properly, thereby being able to make more accurate judgments.

Other aspects and advantages of the invention will be apparent from the following description and the appended claims.

DESCRIPTION OF THE PREFERRED EMBODIMENTS

Figure 1:
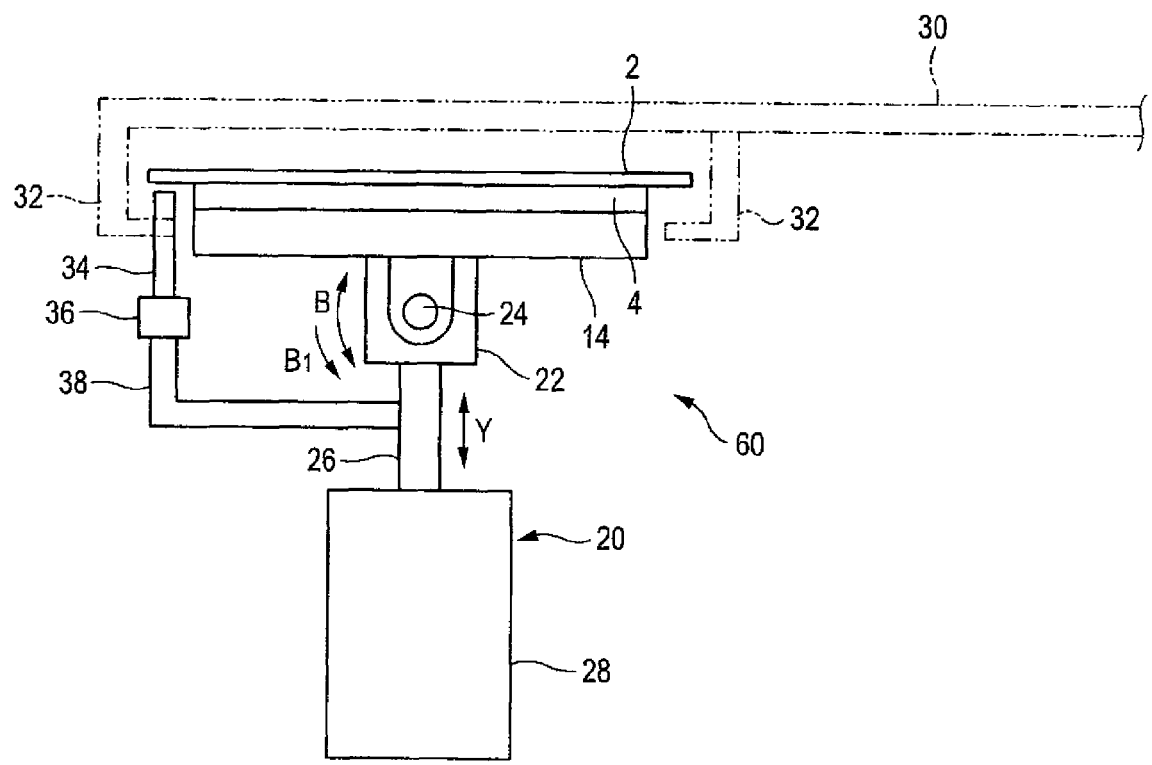
FIG. 1 is a side view of an embodiment of a mechanism portion and a sensor neighboring portion of a substrate hold apparatus according to the invention, showing an example of the state of a substrate just before the removing operation of the substrate is started.

FIG. 1 is a side view of an embodiment of a mechanism part and a force sensor area of a substrate hold apparatus according to the invention, showing an example of the state thereof just before removal of the substrate is started.

This substrate hold apparatus 60 includes an electrostatic chuck 4 for electrostatically attracting and holding a substrate (for example, a semiconductor substrate) 2 thereon, a holder 14 for holding the electrostatic chuck, a push-up member 34 contactable with the end (one end) neighboring portion of the substrate 2 on the electrostatic chuck 4 from below for pushing up the substrate 2, and a rotation apparatus 22 serving also as a drive apparatus for driving the electrostatic chuck 4 (in this embodiment, as will be discussed later, inclining the electrostatic chuck 4 slightly) to thereby allow the push-up member 34 to push up the substrate 2.

Figure 5:
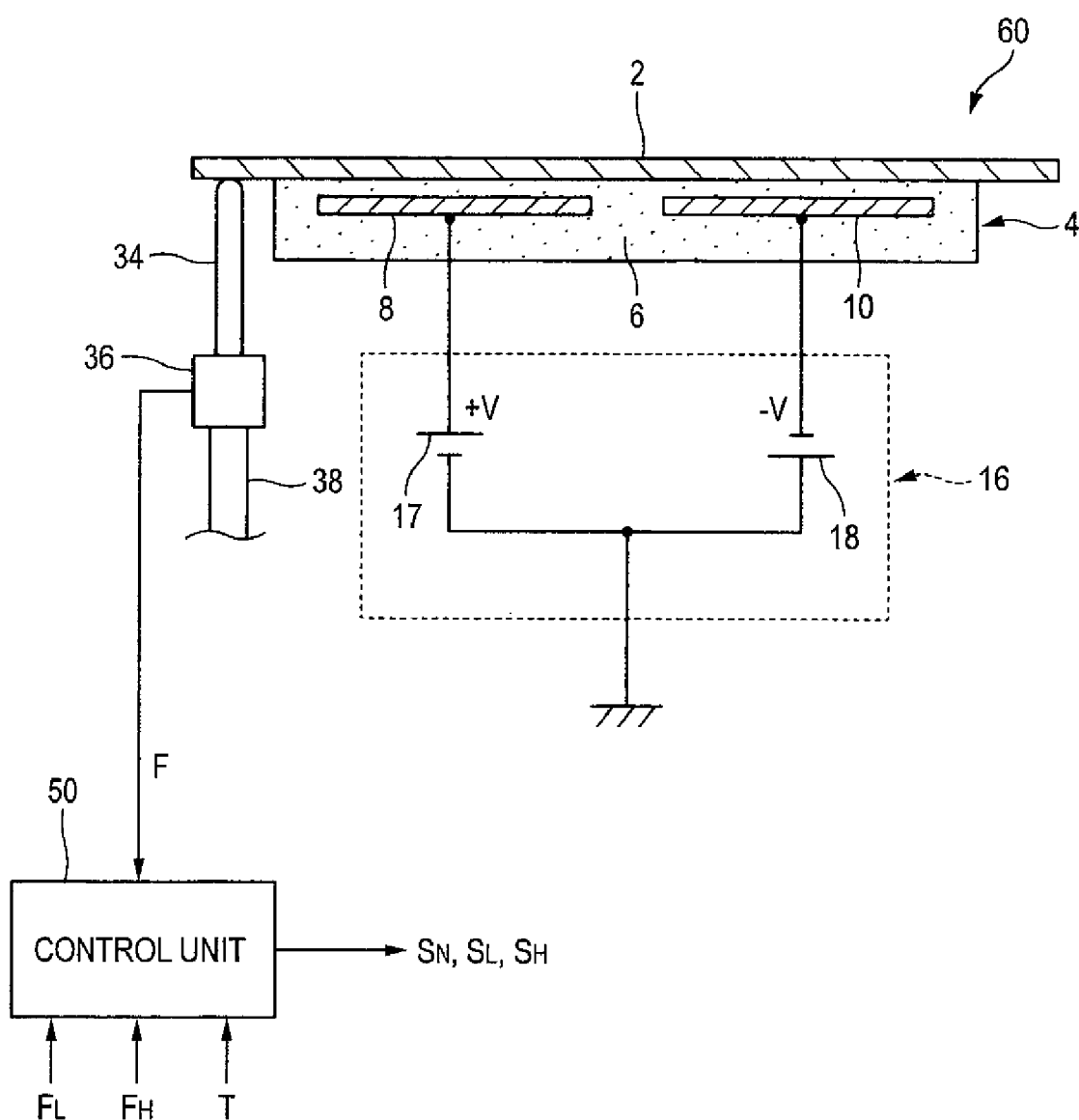
FIG. 5 shows an embodiment of an electrical structure used in the substrate hold apparatus according to the invention.

And, the substrate hold apparatus 60, as shown in FIG. 5, further includes a force sensor 36 for detecting a force F applied to the push-up member 34 in a direction extending along the push-up direction when the substrate 2 is pushed up, and a control unit 50 for measuring the force F detected by the force sensor 36 to carry out the below-mentioned processings such as a checking or judging processing. The force F applied to the push-up member 34 may also be referred to as a force which, as the push-up member 34 pushes up the substrate 2, is applied to the push-up member 34 from the substrate 2 as a reaction. The push-up member 34 also transmits a force, which is applied thereto from the substrate 2 when it pushes up the substrate 2, to the force sensor 36.

There are used a single push-up member 34 and a single force sensor 36. However, as described later, this is not limitative. This applies similarly also in the other embodiments that will be discussed later.

A rotation apparatus 22, in the present embodiment, constitutes a portion of a chuck drive apparatus 20. That is, the chuck drive apparatus 20 includes the rotation apparatus 22 which rotates or reciprocates the electrostatic chuck 4 holding the substrate 2 thereon as well as the holder 14 about a rotation shaft 24 in such a manner as shown by an arrow mark B between a state where they are erected and a state where they are laid down as shown in FIG. 1 (for example, substantially in a horizontal state), and an up-and-down apparatus 28 for moving up and down the electrostatic chuck 4 with holding the substrate 2, holder 14 and rotation apparatus 22 through an up-and-down shaft 26 in such a manner as shown by an arrow mark Y.

Figure 4:
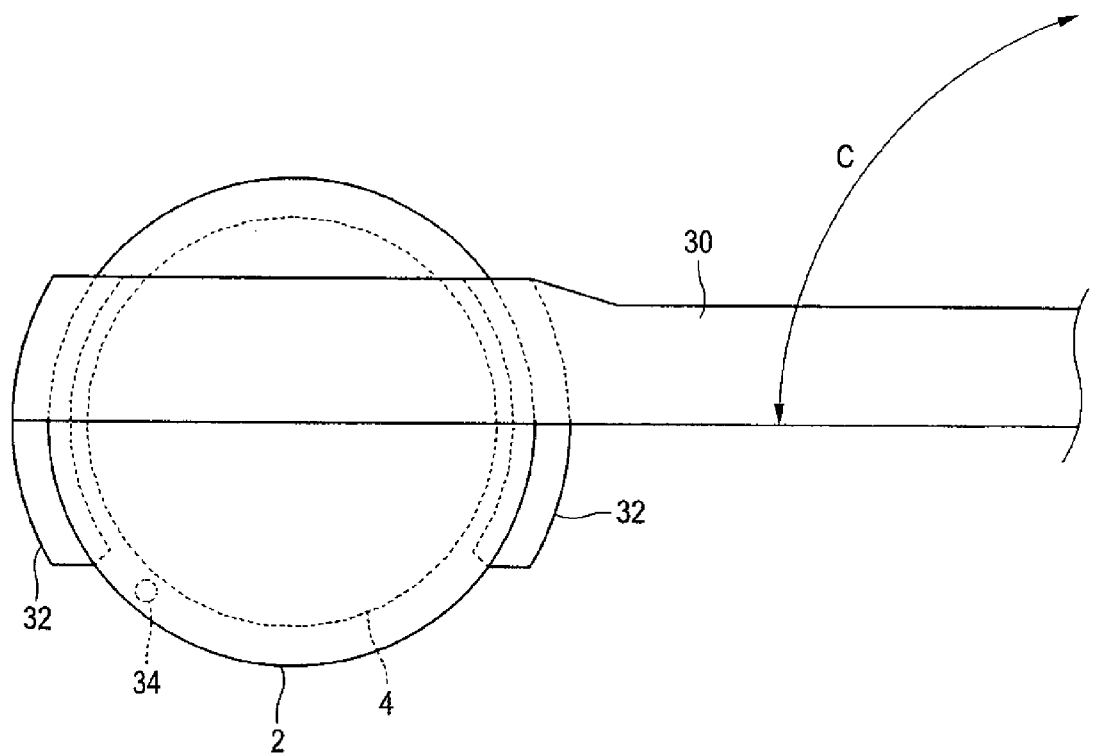
FIG. 4 is a plan view of an example of a substrate delivery arm neighboring portion of the substrate hold apparatus.

In a state where the substrate 2 and the like are erected, for example, when an ion beam (not shown) is radiated onto the substrate 2, ions may be implanted into the substrate 2. In a state where the substrate 2 is laid down horizontally, the substrate 2 may be delivered between the electrostatic chuck 4 and a substrate delivery arm 30 (for example, an ion implanted substrate 2 is replaced with an ion pre-implanted substrate 2). In this case, the substrate delivery arm 30, for example, as shown in FIG. 4, is swung within a horizontal plane in such a reciprocating direction as shown by an arrow mark C. When delivering the substrate 2 between the substrate delivery arm 30 (more specifically, the substrate support portion 32 thereof) and electrostatic chuck 4, the electrostatic chuck 4 carrying the substrate 2 thereon may be moved down using the up-and-down apparatus 28, or, instead, the substrate delivery arm 30 may be moved up, or both of them may be used in combination. In the described below, the electrostatic chuck 4 is moved down.

FIG. 5 shows an example of the structure of the electrostatic chuck 4 and an attraction power supply 16. An electric structure is shared in the respective embodiments of the substrate hold apparatus 60 which will be discussed below.

The electrostatic chuck 4, in the example, is a dipole type electrostatic chuck which is structured such that two electrodes 8 and 10 are provided near to the surface of an insulating material 6 made of, for example, ceramics. The two electrodes 8 and 10 are embedded in the insulating material 6, for example, they are both formed in a semicircular shape and are disposed opposed to each other to thereby form a circle. To the electrostatic chuck 4, specifically, to the electrodes 8 and 10 thereof, there are applied from the attraction power supply 16 dc voltages for attraction (these are referred to as attraction voltages) +v and −v respectively. The attraction power supply 16, in this embodiment, includes a positive power supply 17 for applying the voltage +v, and a negative power supply 18 for applying the voltage −v.

When the attraction voltage is applied onto the electrostatic chuck 4 from the attraction power supply 16, positive and negative electric charges gather between the substrate 2 and electrodes 8, 10, whereby the substrate 2 is attracted and held to the electrodes 8 and 10 due to Coulomb force acting between them. In such state, when, for example, an ion beam is radiated onto the substrate 2, ions may be implanted into the substrate 2.

However the above-mentioned structure of the electrostatic chuck 4 and attraction power supply 16 is just an example. Alternatively, the electrostatic chuck 4 may have another electrode structure, and the attraction power supply 16 may also have a structure which corresponds to such another electrode structure.

Referring again to FIG. 1, the push-up member 34 is supported by a support member 38 which is fixed to the up-and-down shaft 26 serving as an example of a non-rotary part (that is, while the electrostatic chuck 4 is structured so as to be rotatable in the above-mentioned arrow mark B direction, the up-and-down shaft 26 is structured so as not to be rotatable like the electrostatic chuck 4). Therefore, the push-up member 34 may be moved up and down in the Y direction together with the electrostatic chuck 4. Between the push-up member 34 and support member 38, there is interposed the above-mentioned force sensor 36. That is, the force sensor 36, more specifically, detects a force which is applied between the push-up member 34 and support member 38. The force sensor 36 is made of, for example, a piezoelectric element but this is not limitative. And, the shape of the support member 38 is not limited to such an L-like shape as shown in FIG. 1.

The leading end portion of the push-up member 34, when it is viewed from above, for example, as shown in FIG. 4, is situated in the lower portion of the peripheral edge portion of the substrate 2 on the laid-down electrostatic chuck 4. Between the leading end portion of the push-up member 34 and the lower surface of the substrate 2 on the electrostatic chuck 4, before execution of a push-up operation, there intervenes a slight (for example, of the order of several mm of) clearance. The push-up member 34 is formed, for example, as a pin-like member (in this case, it is also referred to as a push-up pin), but this is not limitative. The length of the push-up member 34 is also not limited to any specific one. For example, the forming position of the force sensor 36 may be set high and the length of the push-up member 34 may be set very short.

An operation to remove the substrate 2 from the electrostatic chuck 4 is carried out after the attraction applied voltage to the electrostatic chuck 4 is cut off. Referring in more detail to the removing operation, it is carried out through the following two operations. These two operations are normally a series of operations.

(1) Substrate Push-Up Operation

This is an operation to push up slightly the one position of vicinity of an edge of the substrate 2 on the electrostatic chuck 4 using the push-up member 34, which may also be referred to as an initial removing operation. Specifically, the electrostatic chuck 4, as shown by the arrow mark B1, is slightly (for example, about 1~2 degrees) inclined toward the push-up member 34 from the state thereof just before start of removal thereof shown in FIG. 1 using the rotation apparatus 22 and, as shown in FIG. 2, the one position of vicinity of the edge of the substrate 2 is pushed up slightly by the push-up member 34.

Figure 2:
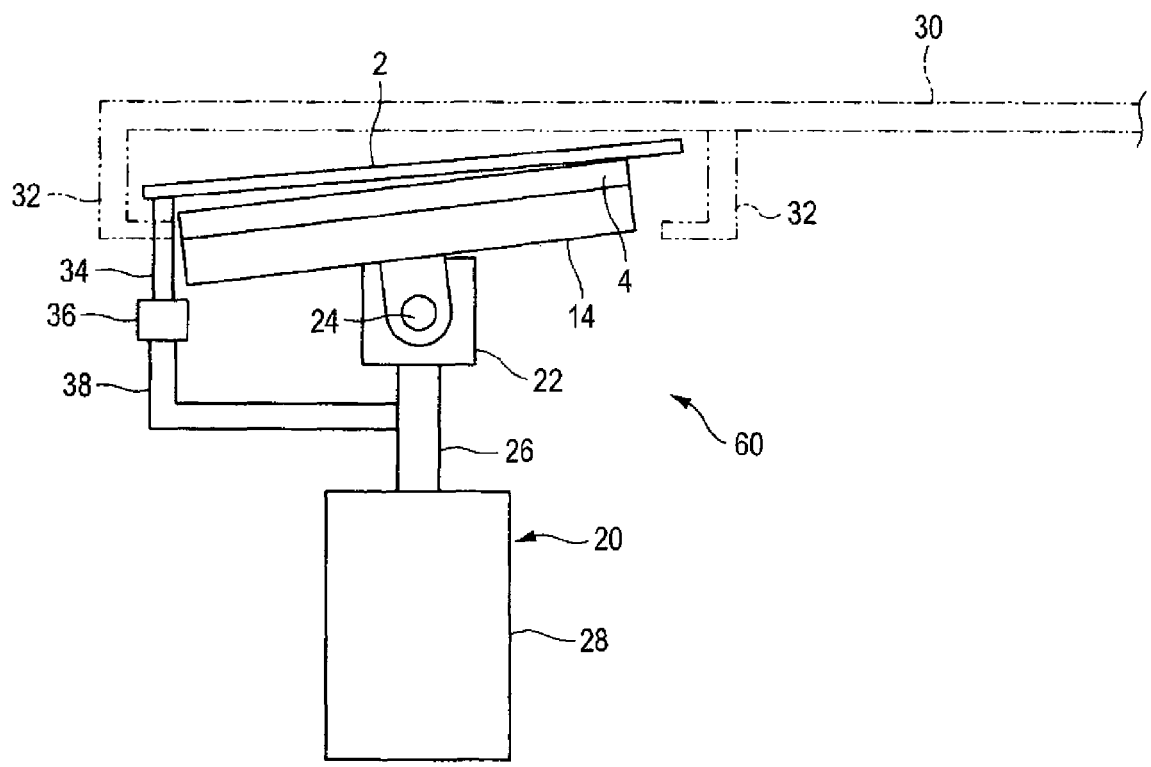
FIG. 2 is a side view of the substrate hold apparatus, showing an example of a state thereof in which an electrostatic chuck shown in FIG. 1 is slightly inclined in the arrow mark B1 direction and the substrate is thereby pushed up.

In this case, preferably, as shown by two-dot chained lines in FIGS. 1 and 2, the substrate delivery arm 30 may be previously set in a standby state where the substrate support portion thereof 32 is ready to receive the substrate 2, and, in this state, the substrate 2 may be pushed up in the above-mentioned manner. According to this arrangement, the substrate 2 may be hardly shifted when it is pushed up and, even if the substrate 2 is shifted, the substrate support portion 32 previously stands by below the substrate 2 to thereby eliminate a likelihood that the substrate 2 may fall down from the electrostatic chuck 4. Therefore, the safety of the substrate 2 may be enhanced. Also, as will be discussed next, the substrate delivery arm 30 may be used to complete the removal of the substrate 2 and, after completion of removal, the substrate 2 may be delivered quickly, thereby being able to eliminate the wasteful wait time and thus enhance the throughput of the substrate push-up operation. This may similarly apply to the other embodiments that will be discussed later.

(2) Removal Completing Operation

Figure 3:
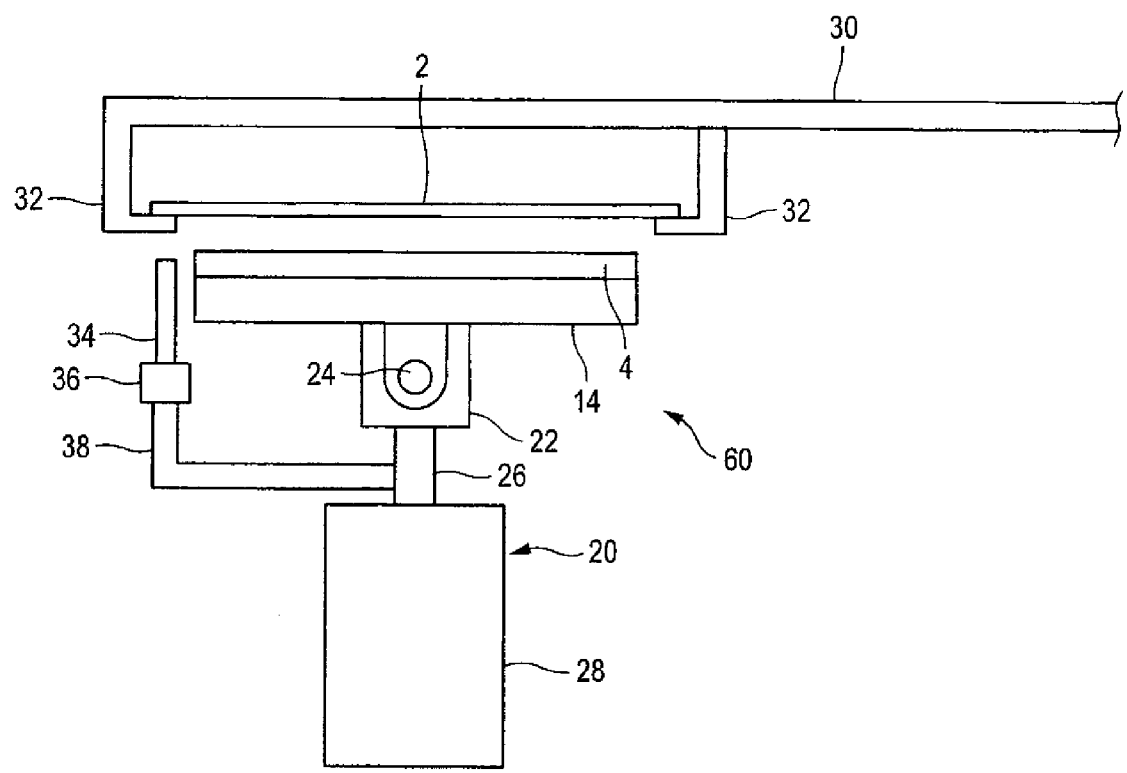
FIG. 3 is a side view of the substrate hold apparatus, showing an example of a state thereof in which an electrostatic chuck shown in FIG. 2 is slightly moved down and the removal of the substrate is completed.

This is an operation which, after the above-mentioned substrate push-up operation, moves down the electrostatic chuck 4 and the like using the up-and-down apparatus 28, as shown in FIG. 3, the substrate 2 is placed onto the substrate delivery arm 30, and the substrate 2 is removed completely from the electrostatic chuck 4.

The control unit 50, in the above-mentioned (1) substrate push-up operation, has a function to carry out various controls including the following checking control and the like.

Figure 6:
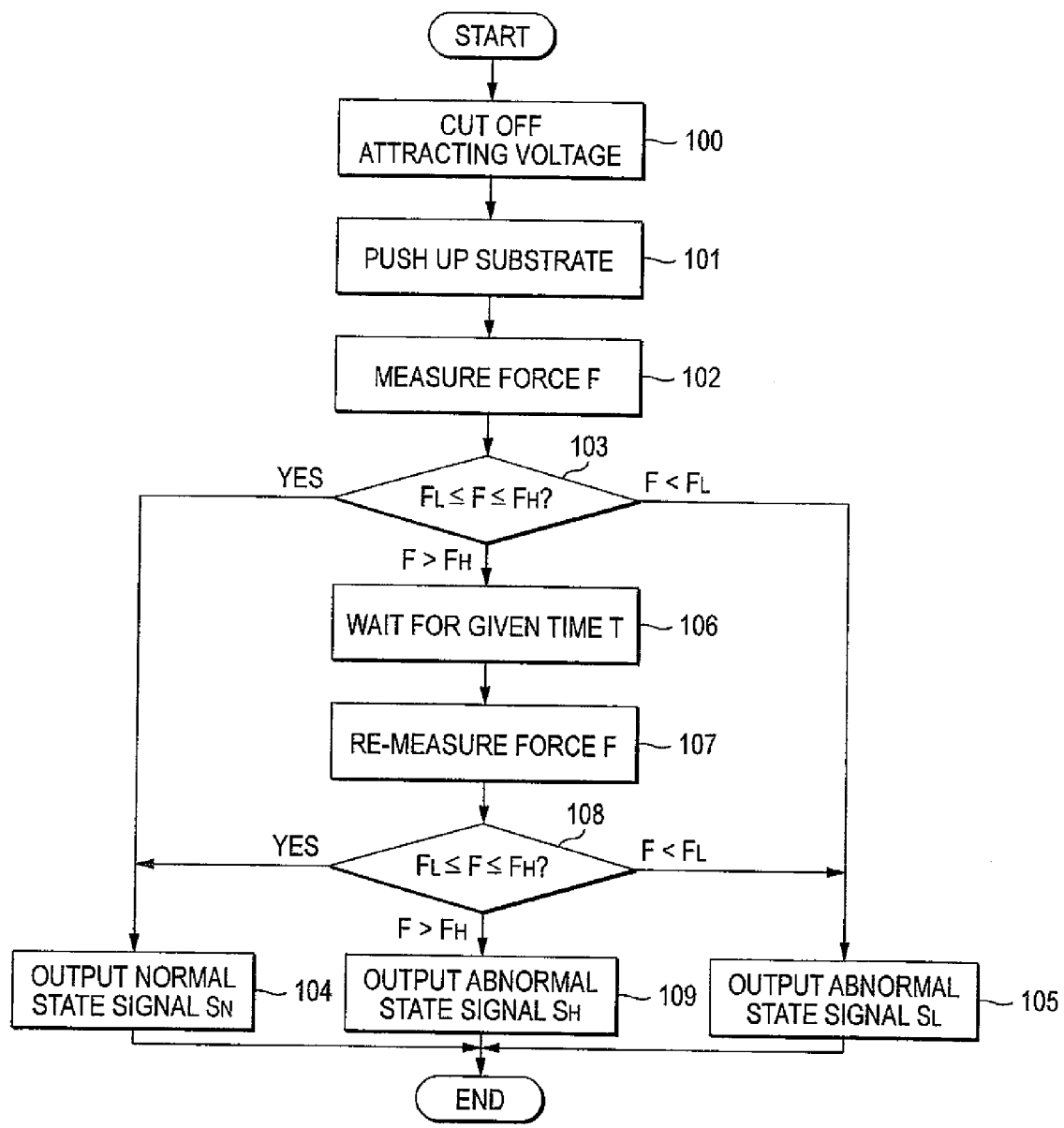
FIG. 6 is a flow chart of an example of the contents of processings to be carried out by a control unit shown in FIG. 5.

That is, as shown in FIG. 6, the control unit 50 cuts off the attraction voltage (Step 100), and it allows the substrate push-up operation shown in the above article (1) to be executed (Step 101), where the control unit 50 measures the force F detected by the force sensor 36 (Step 102).

Alternatively, the control unit 50 or an amplifier (not shown), which is used to amplify a signal from the force sensor 36, may have a peak hold function to hold the peak value of the force F to be detected by the force sensor 36. In this case, the peak value of the force F to be detected by the force sensor 36 may be measured further accurately.

And, the control unit 50 compares the thus measured force F with a given lower limit value FL and a given upper limit value FH to check whether the force F is equal to or larger than the lower limit value FL and is equal to or smaller than the upper limit value FH (that is, $FL \leq F \leq FH$) (Step 103). When the force F is equal to or larger than the lower limit value FL and is equal to or smaller than the upper limit value FH, the processing goes to Step 104 to output a normal state signal SN expressing that the state of the substrate 2 or sensor system is normal. When the force F is smaller than the lower limit value FL (that is, F<FL), the processing goes to Step 105 to output an abnormal signal SL expressing that the state of the substrate 2 or sensor system is abnormal; and, when the force F is larger than the upper limit value FH (that is, F>FH), the processing goes to Step 106 and waits for a given time T.

The above-mentioned upper limit value FH, lower limit value FL and given time T may be previously set in the control unit 50 (see FIG. 5).

The upper limit value FH, for example, may be set for a value equivalent to the sum of the maximum residual attracting force allowed in the (1) substrate push-up operation and a force provided by the weight of the substrate 2. Specifically, the upper limit value FH may be set for about 1.5N~2.0N (newton).

The lower limit value FL, for example, may be set for a value which is larger than 0 and is smaller than a force provided by the weight of the substrate 2 in the (1) substrate push-up operation. Specifically, the lower limit value FL may be set for about 0.2N.

As regards the given time T, when it is too short, a reduction in the residual attracting force (which will be discussed later) is small; and, when it is too long, the throughput is caused to decrease. Therefore, for example, the given time T may be set in the range of 0.5 seconds ~10 seconds or so. Preferably, the time T may be set in the range of 0.5 seconds ~5 seconds, more preferably, in the range of 1 second ~3 seconds, for example, 2 seconds.

And, after waiting by the given time T, the force F being detected by the force sensor 36 is measured again (Step 107). Just before this re-measurement operation, the previously measured value may be reset once.

And, the control unit 50 compares the re-measured force F with the lower limit value FL and upper limit value FH to thereby check whether the re-measured force F is equal to or larger than the lower limit value FL and is equal to or smaller than the upper limit value FH (that is, $FL \leq F \leq FH$) (Step 108) When the force F is equal to or larger than the lower limit value FL and is equal to or smaller than the upper limit value FH, the processing goes to Step 104 to output the signal SN expressing that the state of the substrate 2 or sensor system is normal. When the force F is smaller than the lower limit value FL (that is, F<FL), the processing goes to Step 105 to output an abnormal signal SL expressing that the state of the substrate 2 or sensor system is abnormal; and, when the force F is larger than the upper limit value FH (that is, F>FH), the processing goes to Step 109 to output an abnormal signal SH expressing that the state of the substrate 2 or sensor system is abnormal. As regards the outputting of the above signals SN, SL and SH, refer to FIG. 5 as well.

Outputting of the signals SN, SL and SH substantially completes the operations of the control unit 50 including the checking operations. After then, as the need arises, various controls may be carried out using these signals SN, SL and SH. Also, as the need arises, a further operation may also be executed successively. Description will be given later of this further operation.

In the (1) substrate push-up operation, since an applied voltage to the electrostatic chuck 4 is previously cut off, the force F to be detected by the force sensor 36 provides a value which is the sum of the residual attracting force between the electrostatic chuck 4 and substrate 2 and the force provided by the weight of the substrate 2.

This residual attracting force weakens suddenly when the position of vicinity of the edge of the substrate 2 is pushed up, even if the amount of the push-up motion is quite slight, by the push-up member 34 to thereby peel off the substrate 2 from the electrostatic chuck 4 even if the amount of the peel-off is quite slight. The reason for this is that a polarized state owing to the residual electric charges on the surface of the electrostatic chuck 4 collapses at and from the portion where the substrate 2 is peeled off from the electrostatic chuck 4 and such collapse spreads around, thereby causing the residual attracting force to weaken suddenly. Therefore, even when, in the first measurement, the residual attracting force is large and the force F measured using the force sensor 36 is larger than the upper limit value FH, in the re-measurement of them to be executed after elapse of the given standby time T, it may be expected that the residual attracting force may reduce and the force F measured using the force sensor 36 may be equal to smaller than the upper limit value FH. When the force F is equal to or smaller than the upper limit value FH, it may be judged that the state of the sensor system of substrate 2 is normal; and, in the present substrate hold apparatus 60, it is judged that the state of the substrate 2 or sensor system is normal.

In the JP-A-2004-119792, no attention is paid to the above-mentioned sudden reduction in the residual attracting force. That is, in a single judgment, when it is found that the state of the substrate 2 is abnormal, the processing goes immediately to the residual electric charge removing operation which is different from the originally specified substrate processing operation; and, therefore, the throughput is caused to lower greatly. On the other hand, according to the present substrate hold apparatus 60, special attention is paid to the above-mentioned sudden reduction in the residual attracting force. Specifically, even when, in the first measurement and judgment, the force F detected by the force sensor 36 is found larger than the above-mentioned upper limit value FH, after waiting for the given time T, the force F is measured again to thereby check again whether the force F is larger than the upper limit value FH or not. That is, the check for the residual attracting force is carried out carefully to thereby be able to prevent the throughput from lowering. The term "throughput" may be used to express the throughput of the delivery of the substrate 2, processing and the like to be carried out through the present substrate hold apparatus 60, or the throughput of an apparatus such as an ion implantation apparatus incorporating the present substrate hold apparatus 60 therein.

On the other hand, when it is found that the sensor system, substrate 2 or the like is not in an abnormal state, in the first measuring time and in the re-measuring time as well, the force sensor 36 detects at least the force that is provided by the weight of the substrate 2. Therefore, since the force F to be measured using the force sensor 36 is compared with the above-mentioned lower limit value FL, when the sensor system, substrate 2 or the like is found in an abnormal state, such abnormal state may be detected. For example, when the electrical system of the force sensor 36 is disconnected, the force F to be measured using the force sensor 36 provides 0, which may be detected. Also, when the position of the substrate 2 is greatly shifted on the electrostatic chuck 4, or, in an extreme case, when the substrate 2 does not exist on the electrostatic chuck 4, the force applied to the push-up member 34 is abnormally small and the force to be detected by the force sensor 36 is thereby abnormally small; and, therefore, such abnormal state of the substrate 2 may be detected.

The above technology described with reference FIG. 6, when it is viewed from another point, may also be referred to as such a substrate push-up state checking method as follows. That is, the force F to be detected by the force sensor 36 is measured and, when the thus measured force F is equal to or larger than the lower limit value FL and is equal to or smaller than the upper limit value FH, the substrate 2 or sensor system is judged normal. When the measured force F is smaller than the lower limit value FL, the substrate 2 or sensor system is judged abnormal. When the measured force F is larger than the upper limit value FH, after waiting for the given time T, the force F being detected by the force sensor 36 is measured again. When the re-measured force F is equal to or larger than the lower limit value FL and is equal to or smaller than the upper limit value FH, the substrate 2 or sensor system is judged normal. When the measured force F is smaller than the lower limit value FL, the substrate 2 or sensor system is judged abnormal; and, when the measured force F is larger than the upper limit value FH, the substrate 2 or sensor system is judged abnormal.

By the way, the upper limit value and lower limit value, which are used in the judgment in the first measurement (the above-mentioned step 103), may also be referred to as a first upper limit value and a first lower limit value respectively; and, the upper limit value and lower limit value, which are used in the judgment in the re-measurement (the above-mentioned step 108), may also be referred to as a second upper limit value and a second lower limit value which are different from the first ones, respectively. In this case, the respective upper limit values and lower limit values may be made to correspond to varying states more flexibly, thereby being able to judge the state of the substrate 2 or sensor system more accurately. On the other hand, like the example shown in FIG. 6, when the same lower limit value FL and upper limit value FH are used in both of judgments in the steps 103 and 108, setting of the lower limit value FL and upper limit value FH may be simplified. This applies similarly to the example shown in FIG. 7.

The way to decide the values of the above-mentioned first upper limit value and first lower limit value and second upper limit value and second lower limit value is, for example, similar to the way to decide the values of the previously-mentioned upper limit value FH and lower limit value FL.

Figure 7:
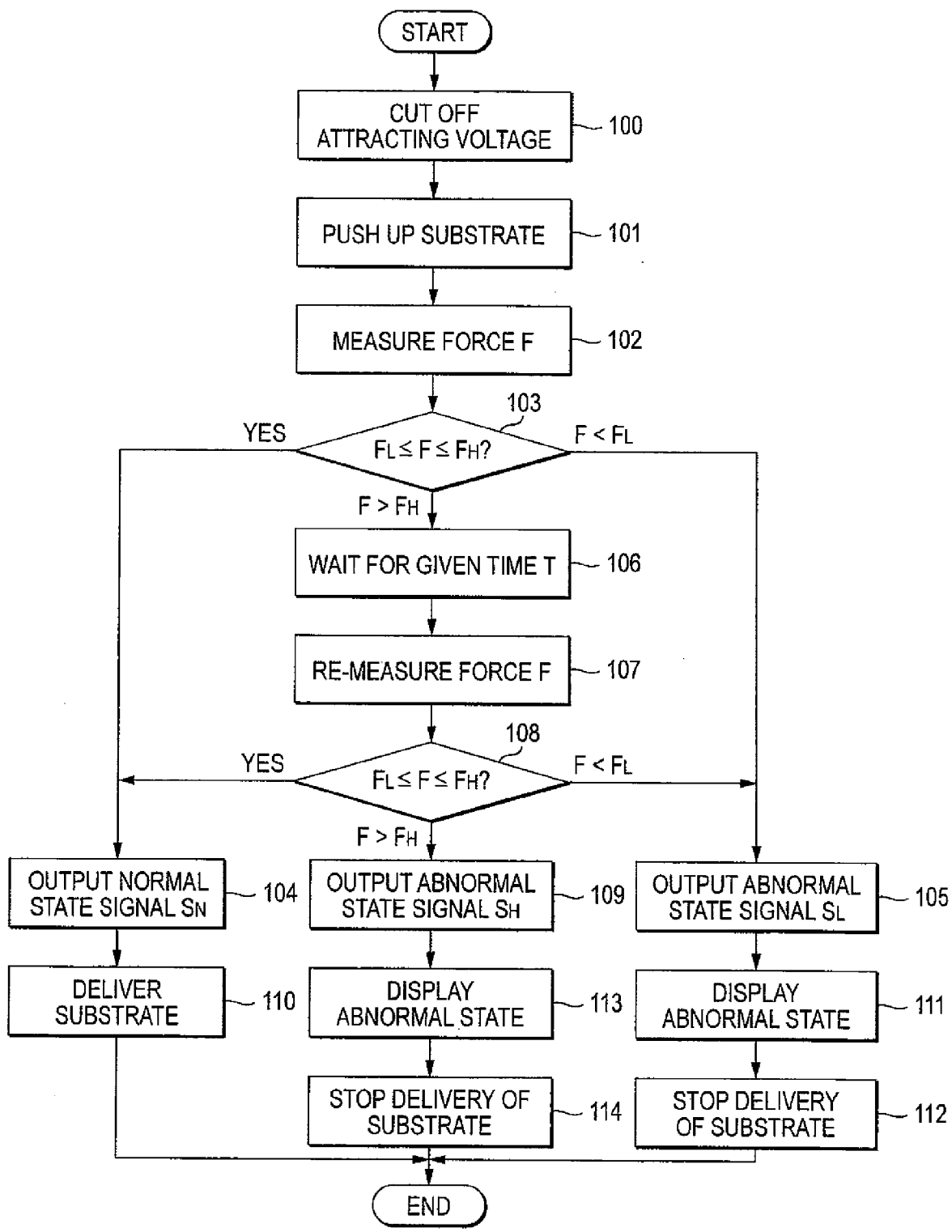
FIG. 7 is a flow chart of another example of the contents of the processings to be carried out by the control unit shown in FIG. 5.

FIG. 7 shows an example when a further operation is executed continuously with the steps 104, 105 and 109 shown in FIG. 6. In the example shown in FIG. 7, following the output of the normal signal SN (Step 104), the substrate 2 is delivered by the substrate delivery arm 30 (Step 110). Following the abnormal signal SL (Step 105), an abnormal state message is displayed (Step 111) and the delivery of the substrate 2 by the substrate delivery arm 30 is stopped. Following the output of the abnormal signal SH (Step 109), an abnormal state message is displayed (Step 113) and the delivery of the substrate 2 by the substrate delivery arm 30 is stopped (Step 114).

After then, for example, the state of the substrate 2 is visually confirmed by an operator who has confirmed the abnormal state display message in Step 113. When no problem is found in the state of the substrate 2, the delivery of the substrate 2 is resumed. If there is found a problem that the substrate 2 has bounced up and dropped down from the electrostatic chuck 4, there may be executed a recovering operation which enables the normal delivery of the substrate 2 and, after then, the delivery of the substrate 2 may be resumed. Also, whether the state of the substrate 2 is abnormal or not and whether the electrical system of the force sensor 36 is disconnected or not may be confirmed visually or in a similar manner by an operator who has confirmed the abnormal state message display in Step 111. When no problem is found, the delivery of the substrate 2 may be resumed. When any problem is found, there is executed an operation to recover the portion that raises the problem and, after then, the delivery of the substrate 2 may be resumed.

(A) When any one of the signals SN, SL and SH is outputted, at least up to the above-mentioned (2) removal completing operation may also be completed. And, (B) when the abnormal state signal SL or SH is outputted, the (2) removal completing operation may not be executed. FIG. 7 shows the example that carries out the (A) operation.

Next, description will be given below of other embodiments of the substrate hold apparatus 60 mainly with reference to differences between these embodiments and the embodiment shown in FIG. 1.

Figure 8:
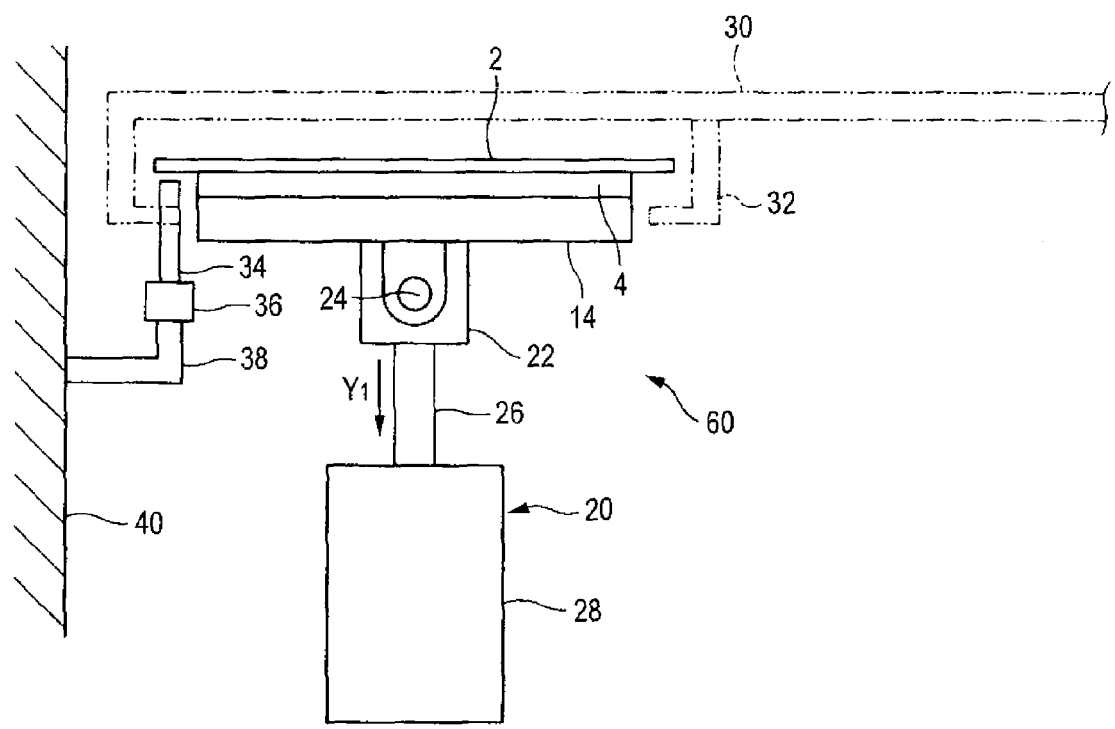
FIG. 8 is a side view of another embodiment of the mechanism portion and sensor neighboring portion of the substrate hold apparatus according to the invention, showing an example of the state of the substrate hold apparatus just before the substrate removing operation is started.

Like an embodiment shown in FIG. 8, the push-up member 34 and support member 38 supporting the force sensor 36 may also be fixed a vacuum container inner wall 40 serving as an example of a non-vertically-moving portion (that is, with respect to the electrostatic chuck 4 which moves vertically in the above-mentioned Y direction, a fixed portion which does not move vertically like the electrostatic chuck 4). The positional relationship between the push-up member 34 and substrate 2 is similar to the embodiment that has been described with reference to FIG. 1.

Figure 9:
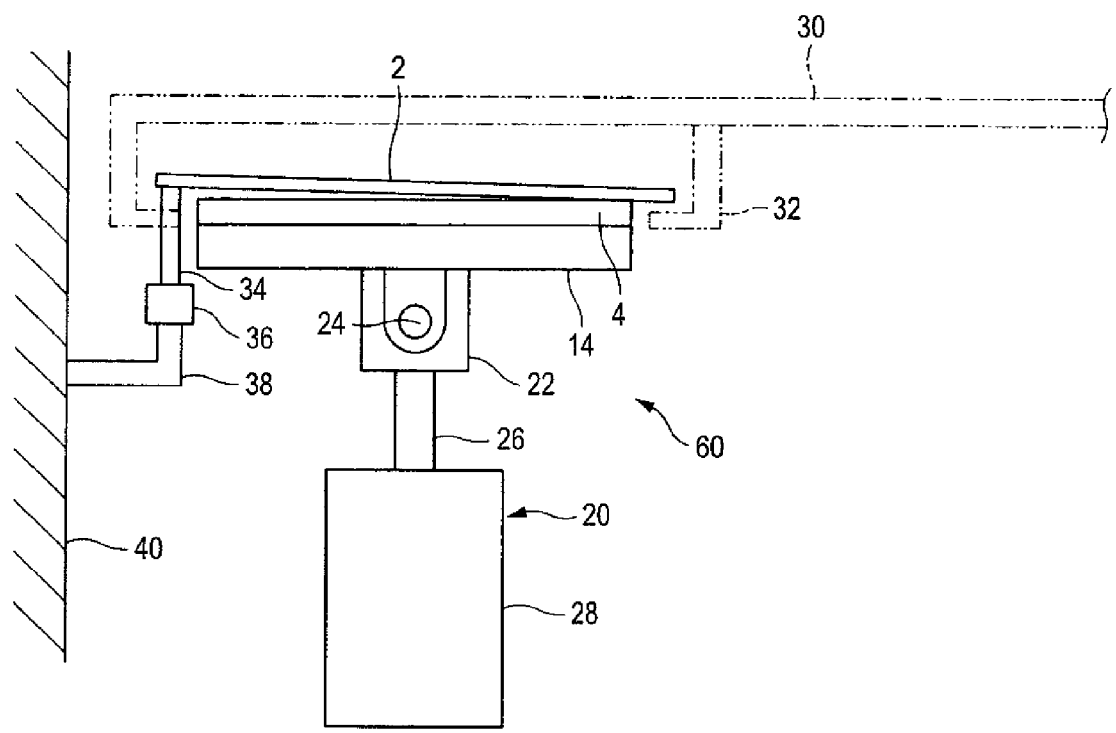
FIG. 9 is a side view of the substrate hold apparatus, showing an example of the state thereof in which an electrostatic chuck shown in FIG. 8 is slightly moved down in the arrow mark Y1 direction and a substrate is thereby pushed up.

In this embodiment, when the electrostatic chuck 4 is moved down slightly in the Y1 direction by the up-and-down apparatus 28, as shown in FIG. 9, the substrate 2 may be pushed up by the push-up member 34. That is, there may be executed the above-mentioned (1) substrate push-up operation may be carried out. Therefore, according to the present embodiment, the up-and-down apparatus 28 functions also as a drive apparatus which drives the electrostatic chuck 4 to push up the substrate 2. The rotation apparatus 22 is not always essential for the substrate 2 removing operation.

Figure 10:
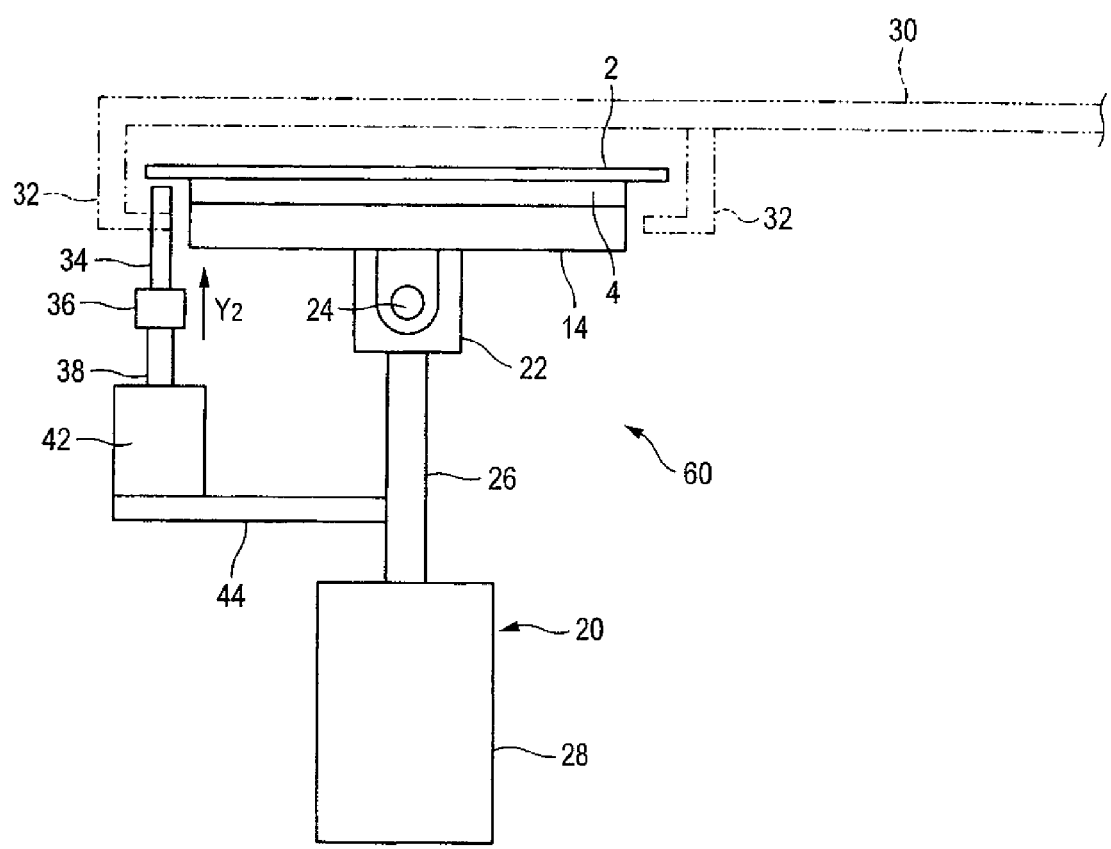
FIG. 10 is a side view of still another embodiment of the mechanism portion and sensor neighboring portion of the substrate hold apparatus according to the invention, showing an example of the state of the substrate hold apparatus just before the substrate removing operation is started.

Like an embodiment shown in FIG. 10, there may also be provided an up-and-down apparatus 42 which pushes up the support member 38 and moreover the push-up member 34 supported by the support member 38 in such a manner as shown by the arrow mark Y2. The up-and-down apparatus 42 is supported by a support member 44 which is fixed to the above-mentioned up-and-down shaft 26. The positional relationship between the push-up member 34 and substrate 2 is similar to the embodiment that has been described with reference to FIG. 1.

According to the present embodiment, when the push-up member 34 is moved up slightly in the Y2 direction by the up-and-down apparatus 42, the substrate 2 may be pushed up by the push-up member 34. That is, there may be executed the above-mentioned (1) substrate push-up operation. Therefore, according to the present embodiment, the up-and-down apparatus 42 constitutes a drive apparatus which drives the push-up member 34 to thereby push up the substrate 2. The rotation apparatus 22 is not always essential for the substrate 2 removing operation.

Alternatively, as the need arises, between the steps 108 and 109 respectively shown in the above-mentioned FIGS. 6 and 7, there may also be carried out once or two or more times the operations that are similar to those shown in the steps 106~108.

Figure 11:
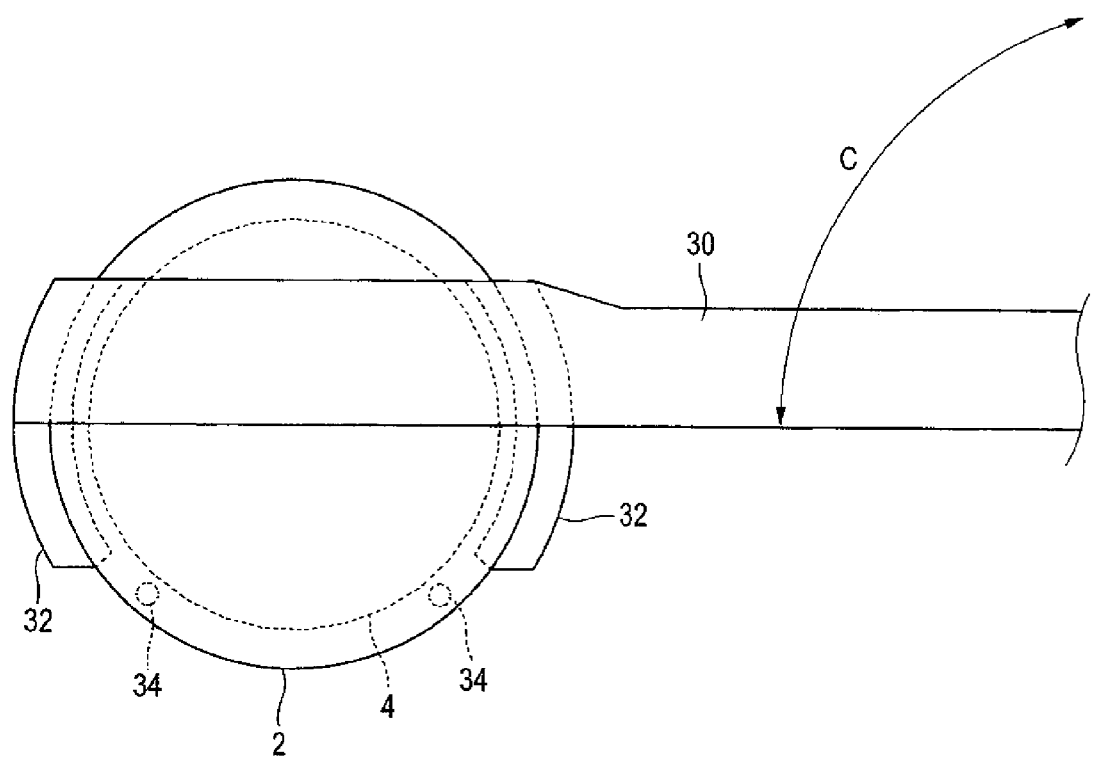
FIG. 11 is a plan view of another example of the substrate delivery arm neighboring portion of the substrate hold apparatus.

Also, as the need arises, there may also be provided m (m is an integer which is two or more) pieces of the above-mentioned type push-up members 34 which are used to push up the position of vicinity of the edge of the substrate 2. In this case, preferably, m pieces of push-up members 34 may be provided rather nearer to one side of the peripheral edge portion of the substrate 2 than dispersed over the entire periphery of the peripheral edge portion of the substrate 2. The reason for this is that the substrate 2 may be peeled off gradually at and from the portion where the push-up members 34 are provided. FIG. 11 shows an example in which there are provided two push-up members 34.

When providing the m pieces of push-up members 34, the above-mentioned force sensor 36 may also be disposed in one of the push-up members 34, or the above-mentioned force sensor 36 may also be disposed in each of n (n is an integer satisfying the condition, $2 \leq n \leq m$) pieces of push-up members 34. In either case, each force sensor 36 is used to detect a force which, in the above-mentioned push-up operation, is applied to its associated (corresponding) push-up member 34.

In the case where there are provided m pieces of push-up members 34, the values of upper limit value and lower limit value such as the above-mentioned upper limit value FH and lower limit value FL may be set so as to correspond to the number of push-up members 34. For example, When providing the m pieces of push-up members 34, the above-mentioned force sensor 36 may also be disposed in one of the push-up members 34, such value may be set for 1/m or so.

In the case where there are provided force sensors 36 one for each of n pieces of push-up members 34, one of the forces measured using the n pieces of force sensors 36 may be selected, and the thus selected force may be compared with the upper limit value and lower limit value such as the above-mentioned upper limit value FH and lower limit value FL to thereby judge whether the state of the substrate 2 or sensor system is a normal or abnormal.

Also, when the force F detected by the force sensor 36 is measured and the measured force is compared with the above-mentioned upper limit value and lower limit value to thereby carry out the above judgment, (A) the force F detected by the force sensor 36 as it is may be used as the measured force, or (B) a force obtained by enforcing a certain processing on the force F detected by the force sensor 36 (for example, a force obtained by enforcing at least one of four arithmetic processings; addition, subtraction, multiplication and division using a given value on the force F detected by the force sensor 36) may be used as the measured force, or (C) the force F detected by the force sensor 36 may be converted to a force per area, that is, a pressure, and the thus converted pressure may be used as the measured force. Here, the above-mentioned respective embodiments are examples according to the above-mentioned (A) method. The above-mentioned (C) method may also be referred to as an example of the (B) method.

And, there is also available a method for detecting a pressure P which is applied to the push-up member 34 when the substrate 2 is pushed up. In this case, the pressure P is a quotient obtained when the force F is divided by an area S, and the area S is the constant value that is determined by the dimension of the push-up member 34 or the like. Therefore, this method may also be said that it substantially detects the force F.

What is claimed is:

1. A substrate holding apparatus comprising:
an electrostatic chuck for electrostatically attracting and holding a substrate thereon;
a push-up member contactable with a position of vicinity of an edge of the substrate on the electrostatic chuck from below for pushing up the substrate;
a drive apparatus for driving at least one of the electrostatic chuck and push-up member to thereby allow the push-up member to push up the substrate;
a force sensor for detecting a force applied to the push-up member in a pushing up operation; and
a control unit,
wherein the control unit is configured to measure the force from the force sensor as a first measurement, output a normal state signal when the measured force in the first measurement is equal to or larger than a lower limit value and is equal to or smaller than an upper limit value, and output an abnormal state signal when the measured force in the first measurement is smaller than the lower limit value, only prior to completely removing the substrate from the electrostatic chuck, the control unit is configured to measure again the force detected by the force sensor as a second measurement after waiting for a time when the measured force in the first measurement is larger than the upper limit value, output the normal state signal when the re-measured force in the second measurement is equal to or larger than the lower limit value and is equal to or smaller than the upper limit value, output the abnormal state signal when the re-measured force in the second measurement is smaller than the lower limit value, and output the abnormal state signal when the re-measured force in the second measurement is larger than the upper limit value, only prior to completely removing the substrate from the electrostatic chuck.

2. The substrate holding apparatus according to claim 1, wherein:

the lower limit has a first lower limit in the first measurement and a second lower limit in the second measurement, the second lower limit being a different value from the first lower limit, and the upper limit has a first upper limit in the first measurement and a second upper limit in the second measurement, the second upper limit being a different value from the first upper limit.

3. The substrate holding apparatus according to claim 1, wherein the push-up member and a support member supporting the force sensor is fixed to a container inner wall.

4. The substrate holding apparatus according to claim 1 further comprising:

an up-and-down apparatus for pushing up a support member and the push-up member.

5. A method for judging a state of a substrate pushing-up comprising the steps of:

1) cutting an applied voltage to an electrostatic chuck,
2) measuring the force from a force sensor by a control unit as a first measurement,
3) outputting a normal state signal when the measured force in the first measurement is equal to or larger than a lower limit value and is equal to or smaller than an upper limit value,
4) outputting an abnormal state signal when the measured force in the first measurement is smaller than the lower limit value,
5) waiting for a time when the measured force in the first measurement is larger than the upper limit value,
6) measuring again the force detected by the force sensor as a second measurement,
7) outputting the normal state signal in the second measurement when the re-measured force is equal to or larger than the lower limit value and is equal to or smaller than the upper limit value,
8) outputting the abnormal state signal in the second measurement when the re-measured force is smaller than the lower limit value, and
9) outputting the abnormal state signal in the second measurement when the re-measured force is larger than the upper limit value, wherein steps 1)-9) are performed only prior to completely removing the substrate from the electrostatic chuck.

6. The method for judging a state of a substrate pushing-up according to claim 5, wherein:

the lower limit has a first lower limit in the first measurement and a second lower limit in the second measurement, the second lower limit being a different value from the first lower limit, and the upper limit has a first upper limit in the first measurement and a second upper limit in the second measurement, the second upper limit being a different value from the first upper limit.

7. The substrate holding apparatus according to claim 1, wherein:

the lower limit value and the upper limit value are different values.

8. The method for judging a state of a substrate pushing-up according to claim 5, wherein:

the lower limit value and the upper limit value are different values.

9. The substrate holding apparatus according to claim 2, wherein:

the first lower limit value and the first upper limit value are different values, and the second lower limit value and the second upper limit value are different values.

10. The method for judging a state of a substrate pushing-up according to claim 6, wherein:

the first lower limit value and the first upper limit value are different values, and the second lower limit value and the second upper limit value are different values.

* * * * *